United States Patent [19]
Bodig et al.

[11] Patent Number: 4,532,437
[45] Date of Patent: Jul. 30, 1985

[54] SPEED-DEPENDENT SIGNAL GENERATOR

[75] Inventors: Bernd Bodig, Leinfelden; Hermann Kull, Stuttgart; Richard Schleupen, Ingersheim, all of Fed. Rep. of Germany

[73] Assignee: Robert Bosch GmbH, Stuttgart, Fed. Rep. of Germany

[21] Appl. No.: 466,851

[22] Filed: Feb. 16, 1983

[30] Foreign Application Priority Data

Mar. 8, 1982 [DE] Fed. Rep. of Germany ....... 3208262

[51] Int. Cl.³ ............................................ H03K 5/153
[52] U.S. Cl. .................................... 307/358; 307/260; 324/166; 324/173; 328/1; 123/414; 123/617
[58] Field of Search ............... 307/264, 354, 358, 362, 307/359, 268, 260; 328/1, 5, 151; 324/166, 173, 174, 207; 123/414, 612, 617, 350

[56] References Cited

U.S. PATENT DOCUMENTS 4,169,232 9/1979 Henrich ................................ 307/264
4,293,814 10/1981 Boyer .................................... 324/173

FOREIGN PATENT DOCUMENTS 2821062 11/1979 Fed. Rep. of Germany .

Primary Examiner—John Zazworsky
Attorney, Agent, or Firm—Frishauf, Holtz, Goodman & Woodward

[57] ABSTRACT

An operational amplifier is used as a threshold switch and an inductive generator that provides a wave used for timing operation of the threshold switch also feeds a circuit that produces a reference current corresponding to the average absolute magnitude of the generator voltage, which, in turn, is fed to at least one current mirror, the output of which is used to shift the operating threshold of the operational amplifier. A second current mirror is used in alternation with the first for half-waves of the generator voltage which are of opposite polarity and a positive feedback connection around the operational amplifier provides a switching characteristic having an appropriate amount of hysteresis so that the inherent timing shift is compensated on switching in response to both positive-going and negative-going portions of the generator output wave.

3 Claims, 2 Drawing Figures

SPEED-DEPENDENT SIGNAL GENERATOR

This invention concerns apparatus for producing, from the periodic voltage of an inductive rotary generator, especially one of the so-called segment type, a signal sequence with a repetition rate dependent upon rotary speed such as is desired, for example, for control of the ignition system of an internal combustion engine. Such apparatus usually contains a threshold switch to which the periodic voltage of the inductive generator is supplied.

Inductive generators have long been used for providing a signal with a repetition rate representing engine speed for the ignition system of a motor vehicle. The generator voltages are supplied to a threshold switch that delivers a signal sequence dependent upon rotary speed. Because of the inductive measurement principle on which the generator operates, the amplitude of the generator voltage also increases with the speed. When the threshold value of the threshold switch stage is constant, the moment at which the threshold switch responds shifts in phase as the result of the amplitude increase. This has the result that the ignition system in which such a generator is used has an overall inherent timing shift.

It is known from German Published Patent Application DE-OS No. 28 21 062 to change the switching threshold by a control voltage which depends upon the period length of the generator voltage. This known apparatus, however, uses the output signal of a threshold stage for generating the control voltage, so that only a partial compensation of the inherent shift is possible in that system. Furthermore, the known apparatus does not lend itself to production in the form of an integrated circuit.

THE INVENTION

It is an object of the present invention to provide compensation for the inherent timing shift in a signal sequence representative of rotary speed derived from the output voltage of an inductive generator which will be a complete compensation, and at the same time to provide apparatus for that purpose that lends itself to manufacture in the form of an integrated circuit.

Briefly, the threshold switch is constituted by an operational amplifier to the inverting input of which the generator voltage is directly or indirectly supplied, while a reference current is produced which corresponds in magnitude to the average value of the absolute magnitude of the generator voltage, which current is supplied to at least one current mirror by which the potential of the aforesaid inverting input of the operational amplifier can be modified to change the switching threshold.

The invention has the advantage that exact compensation of the inherent timing shift is possible over the entire rotary speed range and that the apparatus is so constituted that it can be readily and advantageously made by integrated circuit technology.

With the use of two current mirrors both the rising and descending flanks of a generator signal can be compensated. In such case, the current mirrors are alternately switched into the circuit in dependence upon the output voltage of the operational amplifier. Furthermore, if the two current mirrors are respectively connected between positive and negative poles of a supply voltage and the inverting input of the operational amplifier, while the latter is connected through an input resistor for receiving the generator voltage, both positive and negative half-waves of the generator can be used to operate the threshold switch with compensation in each case for the inherent shifts. In such a case it is desirable to provide the threshold switch with positive feedback to give it a switching characteristic having hysteresis.

THE DRAWING

The invention is further described by way of illustrative example with reference to the annexed drawing, in which.

DESCRIPTION OF THE ILLUSTRATED EMBODIMENT

Figure 1:
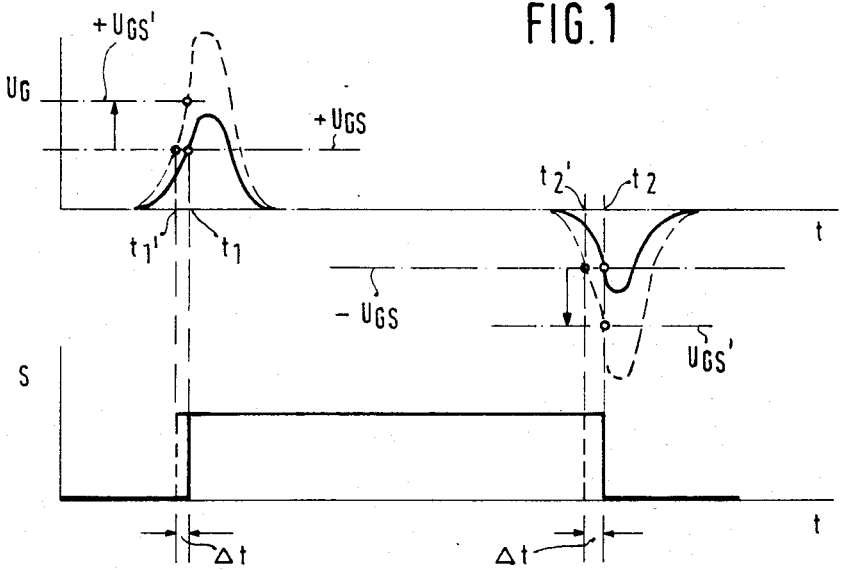
FIG. 1 is a time diagram of the generator voltage and a switching signal.

FIG. 1 shows the voltage $U_G$ of an inductive signal generator such as is usually found in the ignition system of a motor vehicle, plotted in the upper portion of the figure and correlated with a switching characteristic plotted on the same time scale in the lower portion of the figure. It goes practically without saying that the speed-signal generator of the present invention is not limited to use in motor vehicles, but is generally advantageous where an inductive transducer or any other transducer of which the amplitude varies with the speed of the signal to be measured may be used.

The solid-line curve in FIG. 1 of the generator voltage $U_G$ represents the voltage at a first low speed, whereas the broken-line curve represents the generator voltage $U_G$ at a higher speed. When the generator voltage $U_G$ is supplied to a following threshold switch stage that has a threshold voltage $U_{Gs}$, this threshold stage switches over at the moment $t_1$. If bipolar signals of the generator are evaluated and the threshold stage is constituted as a hysteresis switch, which operates at a positive threshold voltage $+U_{Gs}$ and at a negative threshold voltage $-U_{Gs}$, the threshold switch will operate at the moments $t_1$ and $t_2$ in the case of the solid-line generator signal.

If now the speed increases, the signal curve shown in broken lines results, as shown in FIG. 1 without regard to the effect of speed on the time-spacing of the positive and negative half-waves. As is readily visible on the figure, the switching points are shifted in the case of constant threshold voltage from $t_1$, $t_2$ over to $t_1'$, $t_2'$ and that because the signal amplitude has increased. This is expressed in the switching behavior of the threshold stage as shown in the lower part of FIG. 1, where the so-called inherent shift has a value $\Delta t$.

In order to compensate for this inherent shift, it is accordingly necessary to modify the switching threshold and, in the case of the example shown in FIG. 1, actually to a value $+U_{Gs}'$ and $-U_{Gs}'$, respectively.

Figure 2:
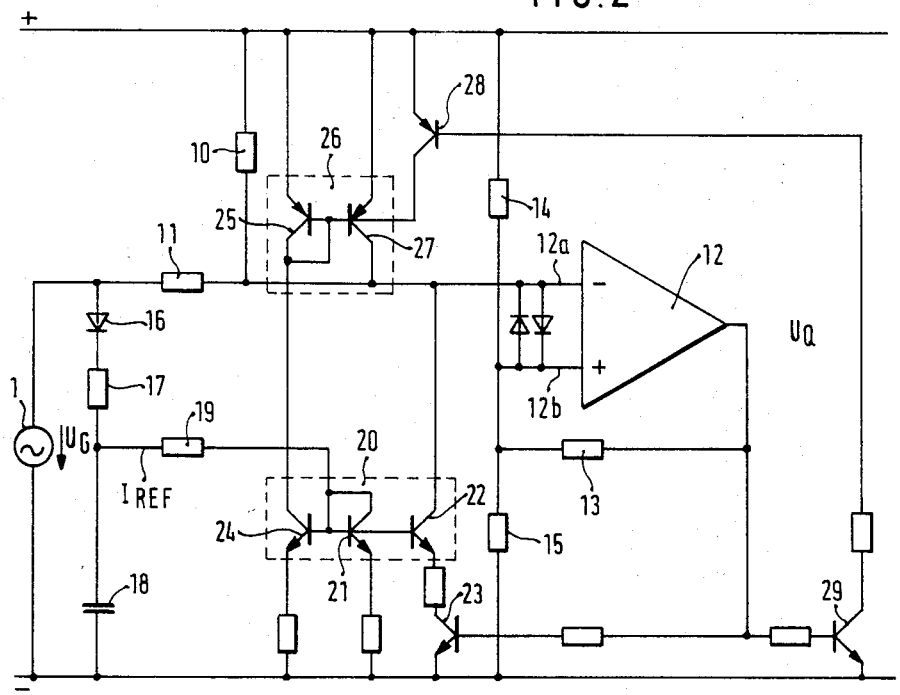
FIG. 2 is a circuit diagram of an embodiment of the invention.

For compensation of the above-described inherent shift, apparatus is used such as is shown for example in the circuit of FIG. 2. In that figure, the inductive signal generator 1 supplies the generator voltage $U_G$. The inductive generator 1 is connected in series with resistances 10 and 11 and the series combination is connected between positive and negative poles of a voltage supply. A conductor leads from the common connection of the resistances 10 and 11 to an inverting input 12a of an operational amplifier 12, of which the non-inverting input 12b is connected to the tap of a voltage divider, constituted of the resistors 14 and 15, which is connected between the poles of the supply voltage. The output signal $U_Q$ of the operational amplifier 12 is fed back to the non-inverting input through a resistor 13 and is connected further as will presently be described.

The inductive generator 1 also supplies voltage to the series combination of a diode 16, a resistor 13 and a capacitor 18, a reference current $I_{REF}$ being taken off from the common connection of the resistor 17 and the capacitor 18 and being supplied, over a resistor 19, to a first current mirror 20. Here the reference current $I_{REF}$ is put through a transistor 21 that is connected as a diode and determines, as one of its functions, the current in another transistor 22 that is connected to the inverting input 12a of the operational amplifier 12. This first current mirror 20 is switched on by a control transistor 23 that is in series with the transistor 22.

The transistor 21 which is connected as a diode also determines the amount of current in another transistor 24 which forms a bank of transistors together with the transistors 21 and 22. The transistor 24 impresses the current $I_{REF}$ on the diode-connected transistor 25 of a second current mirror 26. The current in the diode-connected transistor 25 is then mirrored in another transistor 27 that is also connected to the inverting input 12a, the common base of the transistors 25 and 27 being connected to another control transistor 28 to which the second current mirror 26 can be switched. The output of the operational amplifier 12 directly controls the first control transistor 23 and controls the second control transistor 28 through an inverting transistor 29.

The manner of operation of the circuit of FIG. 2 is as follows:

Assuming first that the two current mirrors 20 and 26 are switched out, the operational amplifier 12, because of the positive feedback through the resistor 13, operates as a hysteresis switch. A positive ultimate threshold value is set by the resistors 10 and 11 that preferably have equal value or values that are about the same. The operational amplifier accordingly switches on when a signal is present at the inverting input 12a that exceeds the predetermined threshold value and then, because of the positive feedback, it reaches its other operating condition and is then capable of being switched back when the signal at the inverting input 12a goes beyond a threshold of the same absolute value, but of the opposite polarity.

In order to carry out the compensation of the inherent shift above described, according to the invention, a signal corresponding to speed is produced in the form of the reference current $I_{REF}$ by means of the components 16, 17 and 18. The diode 16 allows only the half-waves of one polarity of the generator voltage $U_G$ to pass, so that the capacitor 18 is charged at the rhythm of these half-waves, so that a reference current $I_{REF}$ arises which is approximately proportional to the speed. By the turning on of the current mirrors 20 and 26 by the output signal $U_Q$ of the operational amplifier 12 it is assured that one of the current mirrors is always switched on and the other one of the pair switched off. If the output signal $U_Q$ is logic signal 1, the first current mirror 20 is switched on, but if that output signal is logic signal 0, the second current mirror 26 is switched on.

The reference current $I_{REF}$ corresponding to speed is mirrored in the current mirrors 20 and 26 and the potential at the inverting input 12a of the operational amplifier is shifted by the transistors 22 or 27, as the case may be, in such a way that a threshold voltage rising with speed results at the input of the operational amplifier 12 and, in fact, because of the contrary switching in of the current mirrors 20 and 26, this takes place in both directions of polarity. The overall result is then obtained that the threshold voltage values $+U_{Gs}$ and $-U_{Gs}$ are modified with increasing speed to the values $+U_{Gs}'$ and $-U_{Gs}'$ respectively, as illustrated in FIG. 1.

Although the invention has been described with reference to a particular illustrative example, it will be understood that modifications and variations are possible within the inventive concept.

We claim:

1. Apparatus for generating, from the periodic voltage ($U_G$) of an inductive rotary generator, a signal sequence ($U_Q$) dependent upon rotary speed, comprising:
   a voltage threshold switch stage (12) comprising an operational amplifier having its inverting input (12a) connected for receiving said periodic voltage ($U_G$);
   means for producing a reference current ($I_{REF}$) corresponding to the average absolute value of said periodic voltage ($U_G$), and
   at least one current mirror (20, 26) connected for being supplied with said reference current ($I_{REF}$) and for shifting the potential of said inverting input (12a) of said operational amplifier (12) in response to said reference current, and thereby compensating the operation of said operational amplifier as a threshold switch for the inherent timing shift produced by changes in amplitude of said periodic voltage ($U_G$).

2. Apparatus according to claim 1, in which said operational amplifier (12) is provided with a positive feedback circuit for providing it with a hysteresis switching characteristic and in which two current mirrors (20, 26) are provided which are alternately switched in for producing effects of opposite polarity in dependence upon the output voltage ($U_Q$) of said operational amplifier (12).

3. Apparatus according to claim 2, in which said periodic voltage ($U_G$) of said generator is provided to said inverting input (12a) of said operational amplifier (12) through a series resistance (11) and in which said current mirrors (20, 26) are disposed in circuit respectively between positive and negative poles of a supply voltage and said inverting input (12a) of said operational amplifier (12).

* * * * *